United States Patent [19]

Shoji

[11] Patent Number: 5,495,506
[45] Date of Patent: Feb. 27, 1996

[54] AUTOMATIC FREQUENCY CONTROL APPARATUS

[75] Inventor: Takashi Shoji, Tokyo, Japan

[73] Assignee: NEC Corporation, Japan

[21] Appl. No.: 343,255

[22] Filed: Nov. 22, 1994

[30] Foreign Application Priority Data

Dec. 2, 1993 [JP] Japan .................................. 5-302474

[51] Int. Cl.$^6$ .............................................. H04L 27/06
[52] U.S. Cl. ...................... 375/344; 375/331; 455/164.1; 329/306
[58] Field of Search .................................. 375/344, 329, 375/330, 331; 455/164.1, 164.2, 182.1, 182.2; 332/103; 329/304, 306

[56] References Cited

U.S. PATENT DOCUMENTS

| | | | |
|---|---|---|---|
| 5,020,131 | 5/1991 | Isoe | 455/10 |
| 5,148,451 | 9/1992 | Otasi et al. | 375/344 |
| 5,276,210 | 1/1994 | Iwasaki | 375/94 |
| 5,363,415 | 11/1994 | Iwasaki | 375/344 |
| 5,376,894 | 12/1994 | Petranovich | 329/306 |

*Primary Examiner*—Stephen Chin
*Assistant Examiner*—Bryan E. Webster
*Attorney, Agent, or Firm*—Laff, Whitesel, Conte & Saret, Ltd.

[57] ABSTRACT

An automatic frequency control apparatus includes a frequency converter, an analog/digital converter, extractor, a storage unit, a controller, and a local oscillator. The storage unit stores unique word frequency modulation models representing time waveforms obtained by modulating, with a unique word, three frequencies which are a frequency equal to that of a desired intermediate-frequency signal, a frequency slightly higher than that of the desired intermediate-frequency signal, and a frequency slightly lower than that of the desired intermediate-frequency signal. The controller performs a cross correlation calculation between the intermediate-frequency signal of the unique word component from the extractor and all the unique word frequency modulation models stored in the storage unit, corrects an error of a control signal set in correspondence with a reception channel on the basis of a signal representing a unique word frequency modulation model corresponding to a maximum correlation calculation value, and outputs the control signal. The local oscillator supplies, to the frequency converter, a local oscillation frequency corresponding to the control signal from the controller.

6 Claims, 4 Drawing Sheets

AUTOMATIC FREQUENCY CONTROL APPARATUS

BACKGROUND OF THE INVENTION

The present invention relates to an automatic frequency control apparatus in a digital modulation communication system.

U.S. Pat. No. 5,020,131 "TRANSPONDER FREQUENCY OFFSET COMPENSATION WITH RECURRENTLY ASSIGNED UNIQUE WORDS" discloses a conventional technique for an automatic frequency control apparatus in a communication system in which a unique word is located at a proper position of transmission data, and a carrier is digitally modulated on the basis of the transmission data to transmit the carrier. This conventional automatic frequency control apparatus will be described below with reference to the block diagram shown in FIG. 3.

Referring to FIG. 3, a conventional automatic gain control apparatus is constituted by a frequency converter 1 for converting an input reception RF (Radio Frequency) signal into an IF (Intermediate Frequency) signal, a demodulator circuit 8 for demodulating the IF signal to output demodulated data, unique word detectors 9 to 12 for detecting unique words, a reception frequency control circuit 13 for controlling the oscillation frequency of a frequency synthesizer 15 on the basis of reception channel setting information and outputs from the unique word detectors 9 to 12, a reception channel setting circuit 14 for outputting the reception channel setting information set in the reception frequency control circuit 13, and a frequency synthesizer 15 for outputting a local oscillation frequency to the frequency converter 1.

The input RF signal is mixed with a local oscillation frequency output from the frequency synthesizer 15 to obtain an IF signal, and the IF signal is input to the demodulator circuit 8. The demodulator circuit 8 tunes its frequency to the frequency of the carrier component of an output from the frequency converter 1, extracts a clock from the input IF signal, demodulates data, and outputs demodulated data.

The unique word detectors 9 to 12 are used to detect unique words included in the demodulated data. As the unique word detectors 9 to 12, an arbitrary number of unique word detectors are prepared for different reception channels or different reception frequencies. The unique word detectors detect different unique words, respectively. The reception frequency control circuit 13 detects the channel or frequency of an input signal depending on a specific one of the arbitrary number of unique word detectors which detects a unique word, and controls the frequency set by the reception channel setting circuit 14 to output the frequency to the frequency synthesizer 15. The frequency synthesizer 15 changes an oscillation frequency in accordance with a value indicated by the frequency control circuit 13. In this manner, the automatic frequency control apparatus is realized.

In the conventional automatic frequency control apparatus, an arbitrary number of unique word detectors must be prepared for different reception channels, i.e., different reception frequencies, respectively. For this reason, the frequency accuracy of automatic frequency control is determined by the number of unique word detectors, and the number of unique word detectors is increased to improve the frequency accuracy. In addition, since unique words are detected after a demodulation process, a circuit arrangement in a communication system for digitally demodulating a plurality of subcarriers with transmission data and synthesizing them to transmit the obtained carrier is complicated, thereby avoiding a reduction in circuit scale and circuit integration.

SUMMARY OF THE INVENTION

It is an object of the present invention to provide an automatic frequency control apparatus which can be realized by an irreducible minimum coefficient storage capacity suitable for circuit integration.

In order to achieve the above object of the present invention, there is provided an automatic frequency control apparatus comprising frequency converting means for mixing a reception signal including a digitally modulated unique word with a local oscillation frequency to convert the reception signal into an intermediate-frequency signal, analog/digital converting means for converting the intermediate-frequency signal from the frequency converting means into an intermediate-frequency digital signal, extracting means for separating an intermediate-frequency digital signal of a unique word component from the intermediate-frequency digital signal from the analog/digital converting means to extract the intermediate-frequency digital signal of the unique word component, storing means for storing unique word frequency modulation models representing time waveforms obtained by modulating, with a unique word, three frequencies which are a frequency equal to that of a desired intermediate-frequency signal, a frequency slightly higher than that of the desired intermediate-frequency signal, and a frequency slightly lower than that of the desired intermediate-frequency signal, control means for performing a cross correlation calculation between the intermediate-frequency signal of the unique word component from the extracting means and all the unique word frequency modulation models stored in the storing means and correcting an error of a control signal set in correspondence with a reception channel on the basis of a signal representing a unique word frequency modulation model corresponding to a maximum correlation calculation value, thereby outputting the control signal, and local oscillating means for supplying, to the frequency converting means, a local oscillation frequency corresponding to the control signal from the control means.

DESCRIPTION OF THE PREFERRED EMBODIMENT

Figure 1:
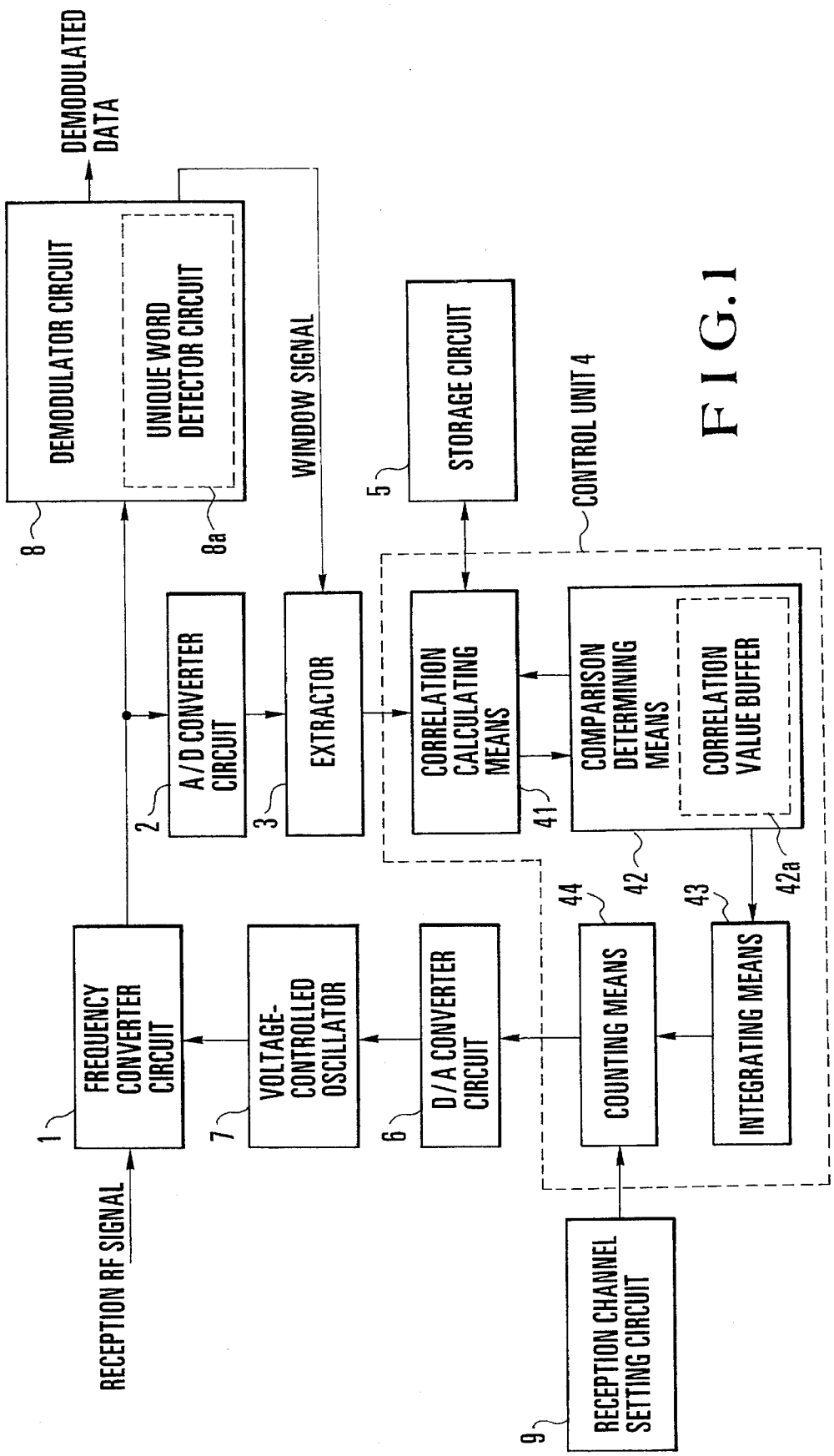
FIG. 1 is a block diagram showing an automatic frequency control apparatus according to an embodiment of the present invention.
Figure 2A:
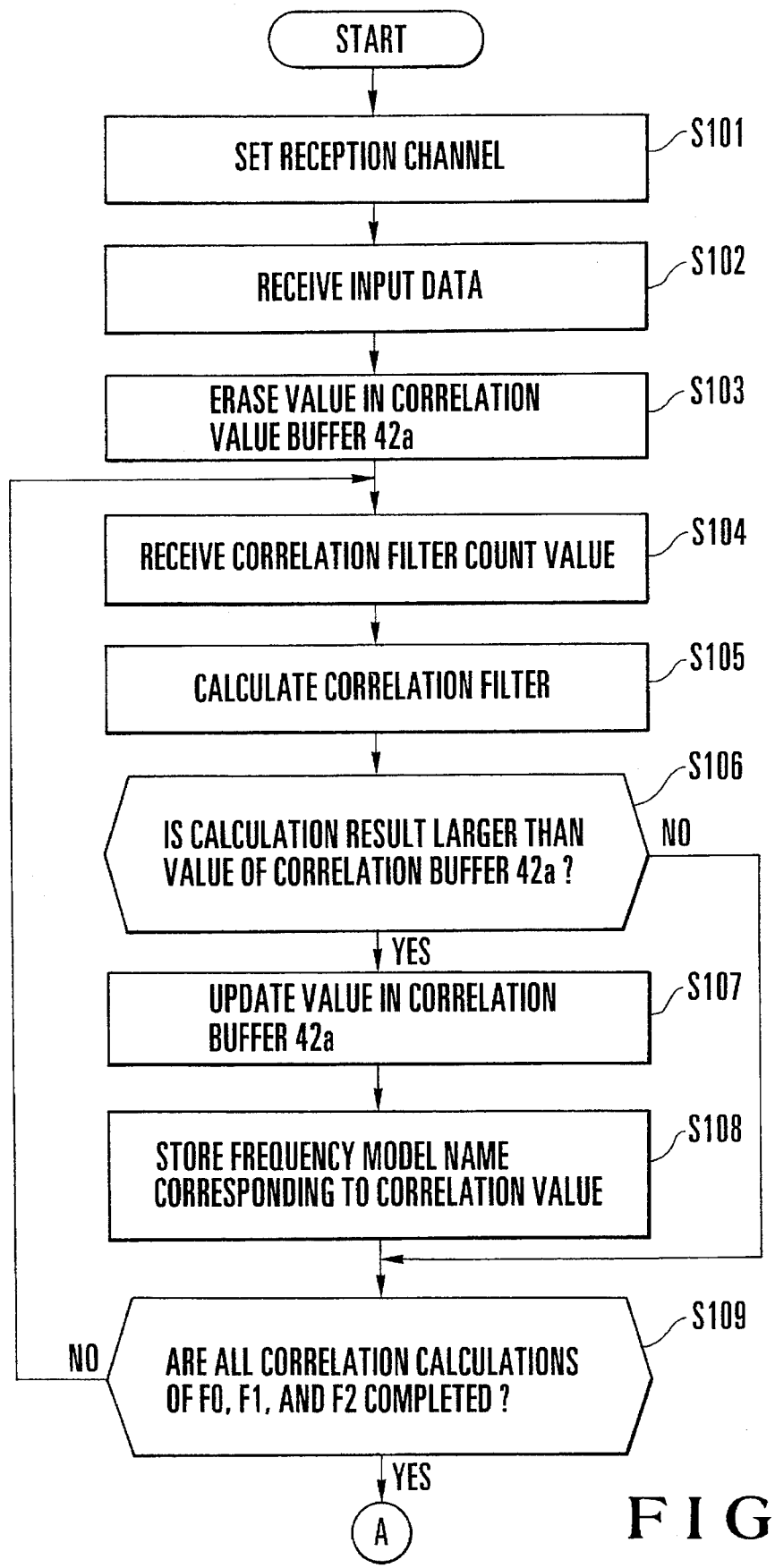
FIGS. 2A and 2B are flow charts for explaining the operation of the control unit shown in FIG. 1.
Figure 2B:
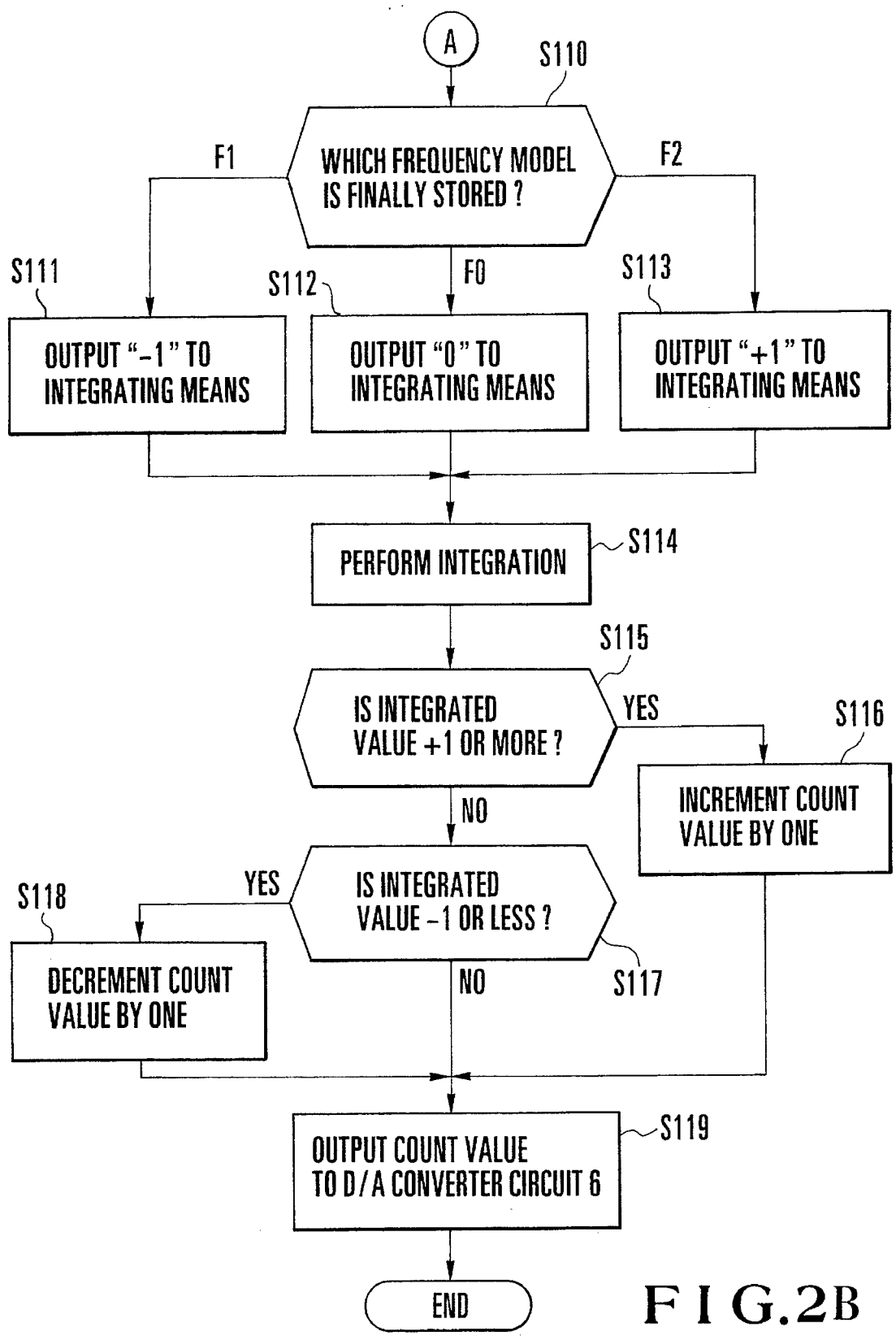
Figure 3:
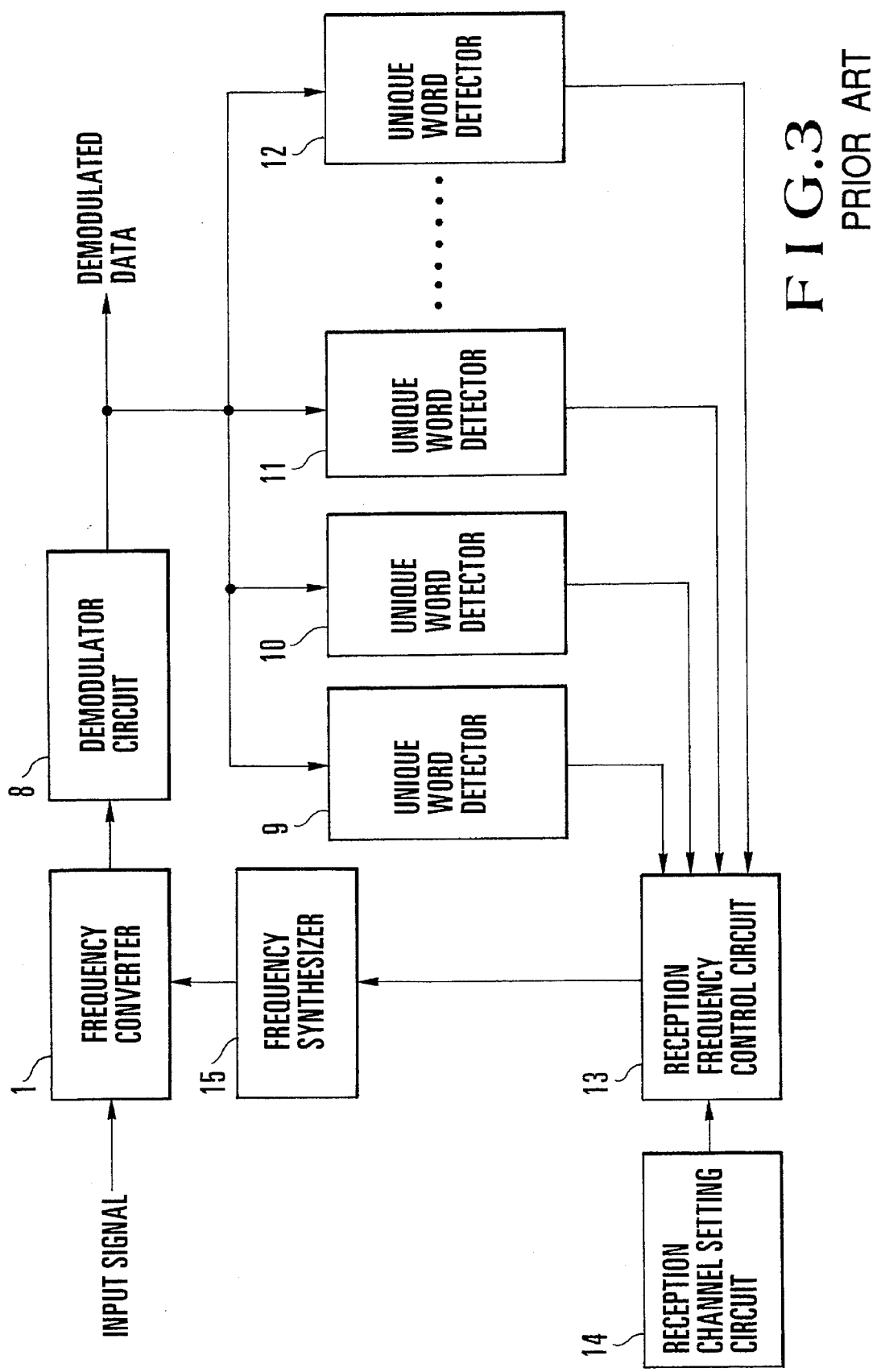
FIG. 3 is a block diagram showing a conventional automatic frequency control apparatus.

An embodiment of the present invention will be described below with reference to the accompanying drawings. FIG. 1 shows an automatic frequency control apparatus according to an embodiment of the present invention. FIGS. 2A and 2B show flow charts for explaining the operation of a control unit 4 shown in FIG. 1.

Referring to FIG. 1, the automatic frequency control apparatus of this embodiment is constituted by a frequency converter circuit 1 for converting an input reception RF signal into an IF signal, an analog/digital converter circuit 2 for quantizing the IF signal from the frequency converter circuit 1 to convert the IF signal into an IF digital signal, an extractor 3 for separating the IF digital signal of a unique word component from an output from the analog/digital converter circuit 2 on the basis of a window signal to extract the IF digital signal, the control unit 4 for outputting a digital control output for controlling a local oscillation frequency on the basis of an output from the extractor 3, reception channel setting information from the a reception channel setting circuit 9, and a unique word frequency modulation model, a storage circuit 5 for storing the unique word frequency modulation models representing time waveforms obtained such that sine waves having three frequencies, i.e., a frequency equal to that of a desired IF signal, a frequency slightly higher than that of the desired IF signal, and a frequency slightly lower than that of the desired IF signal, are modulated by the unique word to output the unique word frequency modulation model to the control unit 4, a D/A (digital/analog) converter circuit 6 for converting a digital control signal from the control unit 4 into a voltage control signal, a voltage-controlled oscillator 7 for controlling a local oscillation frequency output to the frequency converter circuit 1 on the basis of the voltage control signal from the D/A converter circuit 6, and a demodulator circuit 8 for demodulating the IF signal from the frequency converter circuit 1 to output demodulated data and output a window signal corresponding to the unique word component.

The control unit 4 is constituted by a correlation calculating means 41 for calculating the correlation between the IF digital signal of the unique word component from the extractor 3 and the unique word frequency modulation model from the storage circuit 5, a comparison determining means 42 for comparing a correlation calculation value from the correlation calculating means 41 with a value from a correlation value buffer 42a with respect to all the unique word frequency modulation models, an integrating means 43 for sequentially integrating outputs from the comparison determining means 42 to obtain the average of the outputs, and a counting means 44 for performing a calculating operation of addition and subtraction for an initial value set by reception channel setting information from the reception channel setting circuit 9 on the basis of the integration value of the integrating means 43.

The operation of the above automatic frequency control apparatus will be described below with reference to FIGS. 2A and 2B. A reception RF signal is mixed by the frequency converter circuit 1 with an oscillation frequency output from the voltage-controlled oscillator 7 to obtain an IF signal. This IF signal is branched and input to the demodulator circuit 8 and the A/D converter circuit 2. The A/D converter circuit 2 quantizes the IF signal to convert it into an n-bit (n represents an arbitrary integer) digital signal. In the extractor 3, a component corresponding to a unique word component and having an intermediate frequency is extracted from this digital signal in response to a window signal synchronized with the transmission interval of the data of an input signal, i.e., the transmission interval of unique words. The digital signal is input to the control unit 4. Note that this window signal is generated by the demodulator circuit 8 on the basis of a detection result obtained by a unique word detector circuit 8a arranged in the demodulator circuit 8 while the demodulator circuit 8 predicts a period of time in which a next unique word is input.

In the control unit 4, the control operations shown in FIGS. 2A and 2B are performed. A digital value corresponding to a desired local oscillation frequency f0 is set in the counting means 44 as a count value on the basis of the reception channel setting information from the reception channel setting circuit 9 (step S101).

The correlation calculating means 41 receives an IF signal corresponding to a unique word component from the extractor 3 (step S102), and, at the same time, clears the correlation value buffer 42a held by the comparison determining means 42 (step S103). A correlation process is performed between the received signal and one of frequency modulation waveforms obtained by modulating, with a unique word, three frequencies stored in the storage circuit 5, i.e., a frequency f0 equal to that of a desired IF signal, a frequency f1 slightly higher than that of the desired IF signal, and a frequency f2 slightly lower than that of the desired IF signal (steps S104 and S105).

In the following description, the unique word frequency modulation models obtained by performing modulation with the three frequencies, i.e., the frequency f0 equal to the desired the desired IF signal, the frequency f1 slightly higher than that of the desired IF signal, and the frequency slightly lower than that of the desired IF signal are represented by unique word frequency models F0, F1, and F2.

The comparison determining means 42 compares an output from the correlation calculating means 41 with the contents of the correlation value buffer 42a. If the former is larger than the later, the contents of the correlation value buffer 42a are updated, one of the unique word frequency models F0, F1, and F2 which is used in this case is stored (steps S106 to S108). The comparison determining means 42 repeats the operations in steps S104 to S108 until correlation calculations with respect to all the frequency models F0, F1, and F2 are completed.

Upon completion of the correlation calculations with respect to all the unique word frequency models F0, F1, and F2 (step S109), the comparison determining means 42 determines one of the unique word frequency models F0, F1, and F2 which is finally stored in the correlation value buffer 42a as a unique word frequency model representing a maximum correlation value (step S110).

The unique word frequency model representing the maximum correlation value is determined as one of the frequency models F0, F1, and F2 as described above. In this case, when the unique word frequency modulation model representing the maximum correlation value is the frequency model F0, the comparison determining means 42 outputs "0", representing that "an input IF signal has a frequency equal to that of the desired IF signal", to the integrating means 43 (step S112). When the unique word frequency modulation model representing the maximum correlation value is the frequency model F1, the comparison determining means 42 outputs "−1", representing that "an input IF signal has a frequency higher than that of the desired IF signal", to the integrating means 43 (step Sill). When the unique word frequency modulation model representing the maximum correlation value is the frequency model F1, the comparison determining means 42 outputs "+1", representing that "an input IF signal has a frequency lower than that of the desired IF signal", to the integrating means 43 (step S113). In this case, the comparison determining means 42 preferably operates to output each output value such that the input IF signal has a frequency equal to that of the desired IF signal. When the unique word frequency modulation model is the frequency model F1, "+1" may be output; when the unique word frequency modulation model is the frequency model F2, "−1" may be output.

In the integrating means 43, outputs from the comparison determining means 42 are sequentially integrated to obtain the average of the outputs (step S114). When the integrated value becomes equal to or more than "+1", the count value of the counting means 44 having an initial value set in step S101 is incremented by one (steps S115 and S116). When the integrated value becomes equal or less than "−1", the count value is decremented by one (steps S117 and S118). Otherwise, the count value is not changed, and the count value is output to the D/A converter circuit 6 (step S119).

As described above, in the control unit 4, after a reception channel is set in step S101, the operations in steps S102 to S119 are repeated, and a digital signal representing a count value for controlling a change in input signal frequency is output to the D/A converter circuit 6. In the D/A converter circuit 6, the quantized digital signal is converted into an analog value, and the analog value is output to the voltage-controlled oscillator 7 as a voltage for controlling a change in input signal frequency. In the voltage-controlled oscillator 7, a local oscillation frequency which is proportional to an output from the D/A converter circuit 6 is output to the frequency converter circuit 1.

As has been described above, according to the present invention, an automatic frequency control apparatus comprises an A/D converting means for quantizing an IF signal to convert it into an IF digital signal, an extracting means for separating the IF digital signal of a unique word component from the IF digital signal to output the IF digital signal of the unique word component, and a correlation coefficient storing means for storing the unique word frequency modulation models modulated by three frequencies, i.e., a frequency equal to that of a desired IF signal, a frequency slightly higher than that of the desired IF signal, and a frequency slightly lower than that of the desired IF signal. A control unit for performing a cross correlation calculation between the IF signal of the unique word component and a unique word frequency modulation model to detect, as an error signal, a frequency difference between the IF signal of the unique word component and the unique word frequency modulation model is arranged in the automatic frequency control apparatus to detect a unique word without demodulating the input signal. Therefore, the automatic frequency control apparatus constituted by an irreducible minimum coefficient storage capacity suitable for circuit integration can be provided.

What is claimed is:

1. An automatic frequency control apparatus comprising:

frequency converting means for mixing a reception signal including a digitally modulated unique word with a local oscillation frequency to convert the reception signal into an intermediate-frequency signal;

analog/digital converting means for converting the intermediate-frequency signal from said frequency converting means into an intermediate-frequency digital signal;

extracting means for separating an intermediate-frequency digital signal of a unique word component from the intermediate-frequency digital signal from said analog/digital converting means to extract the intermediate-frequency digital signal of the unique word component;

storing means for storing unique word frequency modulation models representing time waveforms obtained by modulating, with a unique word, three frequencies which are a frequency equal to that of a desired intermediate-frequency signal, a frequency slightly higher than that of the desired intermediate-frequency signal, and a frequency slightly lower than that of the desired intermediate-frequency signal;

control means for performing a cross correlation calculation between the intermediate-frequency signal of the unique word component from said extracting means and all the unique word frequency modulation models stored in said storing means and correcting an error of a control signal set in correspondence with a reception channel on the basis of a signal representing a unique word frequency modulation model corresponding to a maximum correlation calculation value, thereby outputting the control signal;

local oscillating means for supplying, to said frequency converting means, a local oscillation frequency corresponding to the control signal from said control means;

said control means comprising correlation calculating means for sequentially performing cross correlation calculations between the intermediate-frequency signal of the unique word component from said extracting means and the unique word frequency modulation models in said storing means for each unique word frequency modulation model, and comparison determining means for comparing correlation calculation values of the unique word frequency modulation models from said correlation calculating means with each other to output a signal representing a unique word frequency modulation model corresponding to a maximum correlation calculation value.

2. An apparatus according to claim 1, wherein said control means comprises integrating means for integrating outputs from said comparison determining means to output an integration result as a ternary signal which represents any one of 0, +1, and −1, and counting means, in which an initial value corresponding to a reception channel is set, for outputting, as a control signal to said frequency converting means, a count value obtained by incrementing/decrementing the set initial value in accordance with the ternary signal from said integrating means.

3. An apparatus according to claim 2, wherein said comparison determining means outputs the ternary signal which represents any one of 0, +1, and −1 to said integrating means as a signal representing a unique word frequency modulation model.

4. An apparatus according to claim 2, further comprising setting means for setting an initial value corresponding to a reception channel in said counting means, and digital/analog converting means for converting a count value output from said counting means into a voltage control signal, and wherein said local oscillating means controls the local oscillation frequency in accordance with the voltage control signal from said digital/analog converting means.

5. An automatic frequency control apparatus comprising:

frequency converting means for mixing a reception signal including a digitally modulated unique word with a local oscillation frequency to convert the reception signal into an intermediate-frequency signal;

analog/digital converting means for converting the intermediate-frequency signal from said frequency converting means into an intermediate-frequency digital signal;

extracting means for separating an intermediate-frequency digital signal of a unique word component from the intermediate-frequency digital signal from said analog/digital converting means to extract the intermediate-frequency digital signal of the unique word component;

storing means for storing unique word frequency modulation models representing time waveforms obtained by modulating, with a unique word, three frequencies which are a frequency equal to that of a desired intermediate-frequency signal, a frequency slightly higher than that of the desired intermediate-frequency signal, and a frequency slightly lower than that of the desired intermediate-frequency signal;

control means for performing a cross correlation calculation between the intermediate-frequency signal of the unique word component from said extracting means and all the unique word frequency modulation models stored in said storing means and correcting an error of a control signal set in correspondence with a reception channel on the basis of a signal representing a unique word frequency modulation model corresponding to a maximum correlation calculation value, thereby outputting the control signal;

local oscillating means for supplying, to said frequency converting means, a local oscillation frequency corresponding to the control signal from said control means;

unique word detecting means for detecting a unique word included in a demodulation signal, and demodulating means for demodulating an intermediate-frequency signal from said frequency converting means to output a demodulation signal and outputting, to said extracting means, a window signal having a unique word component predicted on the basis of a detection output from said unique word detecting means, and wherein said extracting means separates the intermediate-frequency digital signal of the unique word component on the basis of the window signal from said demodulating means to extract the intermediate-frequency digital signal of the unique word component.

6. An automatic frequency control apparatus comprising:

frequency converting means for mixing a reception signal including a digitally modulated unique word with a local oscillation frequency to convert the reception signal into an intermediate-frequency signal;

analog/digital converting means for converting the intermediate-frequency signal from said frequency converting means into an intermediate-frequency digital signal;

extracting means for separating an intermediate-frequency digital signal of a unique word component from the intermediate-frequency digital signal from said analog/digital converting means to extract the intermediate-frequency digital signal of the unique word component;

storing means for storing unique word frequency modulation models representing time waveforms obtained by modulating, with a unique word, three frequencies which are a frequency equal to that of a desired intermediate-frequency signal, a frequency slightly higher than that of the desired intermediate-frequency signal, and a frequency slightly lower than that of the desired intermediate-frequency signal;

correlation calculating means for sequentially performing cross correlation calculations between the intermediate frequency signal of the unique word component from said extracting means and the unique word frequency modulation models in said storing means for each unique word frequency modulation model;

comparison determining means for comparing correlation calculation values of the unique word frequency modulation models from said correlation calculating means with each other to output a signal representing a unique word frequency modulation model corresponding to a maximum correlation calculation value;

integrating means for integrating outputs from said comparison determining means to output an integration result as a ternary signal which represents any one of 0, +1, and −1;

counting means, in which an initial value corresponding to a reception channel is set, for incrementing/decrementing the set initial value on the basis of the ternary signal from said integrating means to perform a counting operation;

setting means for setting an initial value corresponding to the reception channel in said counting means;

digital/analog converting means for converting a count value output from said counting means into a voltage control signal; and local oscillating means for supplying, to said frequency converting means, a local oscillation frequency corresponding to the voltage control signal from said digital/analog converting means.

* * * * *